US007385818B2

(12) United States Patent
Heesen

(10) Patent No.: US 7,385,818 B2
(45) Date of Patent: Jun. 10, 2008

(54) COOLING APPARATUS

(75) Inventor: Klaus Heesen, London (GB)

(73) Assignee: Hush Technologies Investments Ltd, London (GB)

( * ) Notice: Subject to any disclaimer, the term of this patent is extended or adjusted under 35 U.S.C. 154(b) by 166 days.

(21) Appl. No.: 10/993,204

(22) Filed: Nov. 18, 2004

(65) Prior Publication Data

US 2005/0135063 A1 Jun. 23, 2005

(30) Foreign Application Priority Data

Nov. 19, 2003 (GB) ................. 0326965.1

(51) Int. Cl.
*H05K 7/20* (2006.01)
*F28F 7/00* (2006.01)
*H01L 23/34* (2006.01)
(52) U.S. Cl. ................. 361/700; 165/104.33; 361/719; 257/719
(58) Field of Classification Search ........... 165/104.33; 257/719; 361/700, 719
See application file for complete search history.

(56) References Cited

U.S. PATENT DOCUMENTS

| 5,549,155 | A | * | 8/1996 | Meyer et al. ........... 165/104.33 |
| 5,730,210 | A | | 3/1998 | Kou |
| 6,181,559 | B1 | | 1/2001 | Seo |
| 6,212,074 | B1 | * | 4/2001 | Gonsalves et al. .......... 361/717 |
| 6,307,748 | B1 | | 10/2001 | Lin et al. |
| 6,366,460 | B1 | | 4/2002 | Stone et al. |
| 6,462,951 | B2 | | 10/2002 | Letourneau |
| 6,639,800 | B1 | | 10/2003 | Eyman et al. |
| 6,865,082 | B2 | * | 3/2005 | Huang et al. .............. 361/700 |
| 7,215,546 | B2 | * | 5/2007 | Hata et al. ................. 361/699 |
| 2003/0192672 | A1 | | 10/2003 | Lee et al. |

FOREIGN PATENT DOCUMENTS

| DE | 20300300 U1 | 3/2003 |
| DE | 20304781 U1 | 7/2003 |
| DE | 20304782 A1 | 8/2003 |
| GB | 2388473 A | 11/2003 |
| JP | 2002280499 A | 9/2002 |
| WO | WO 03088022 A | 10/2003 |

* cited by examiner

*Primary Examiner*—Gregory D Thompson
(74) *Attorney, Agent, or Firm*—Knobbe Martens Olson & Bear LLP

(57) ABSTRACT

A cooling apparatus for cooling an electronic device on a substrate, comprising a first heat sink held in contact with the electronic device, but unconnected with the substrate or the electronic device. The first heat sink is held into contact with the electronic device by a biasing means.

12 Claims, 10 Drawing Sheets

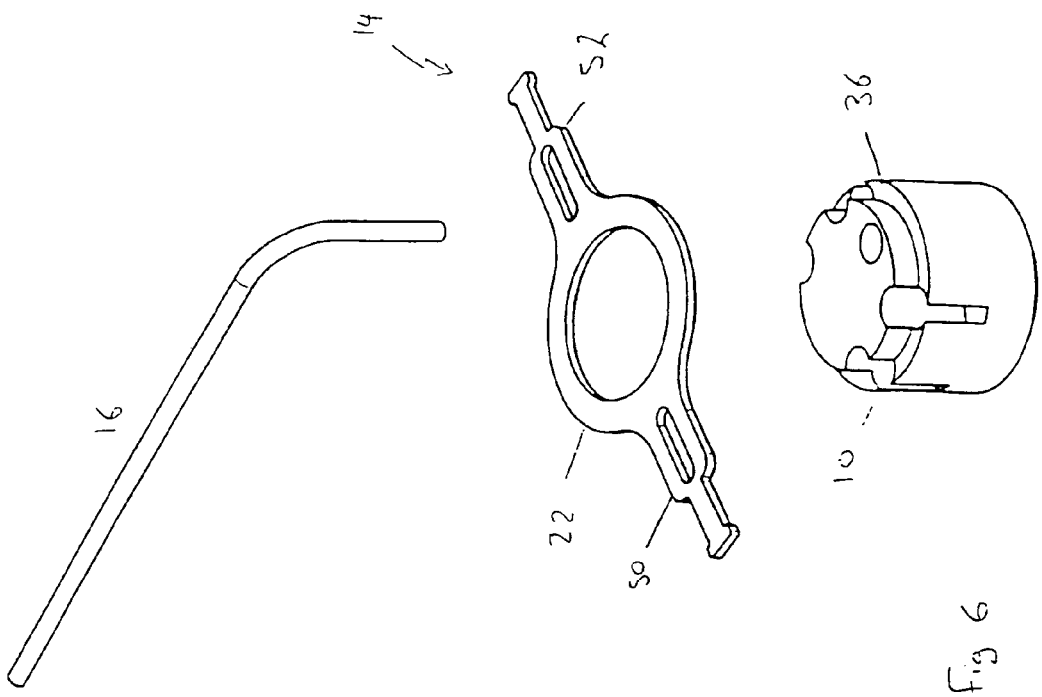
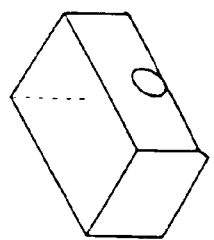
Fig 6

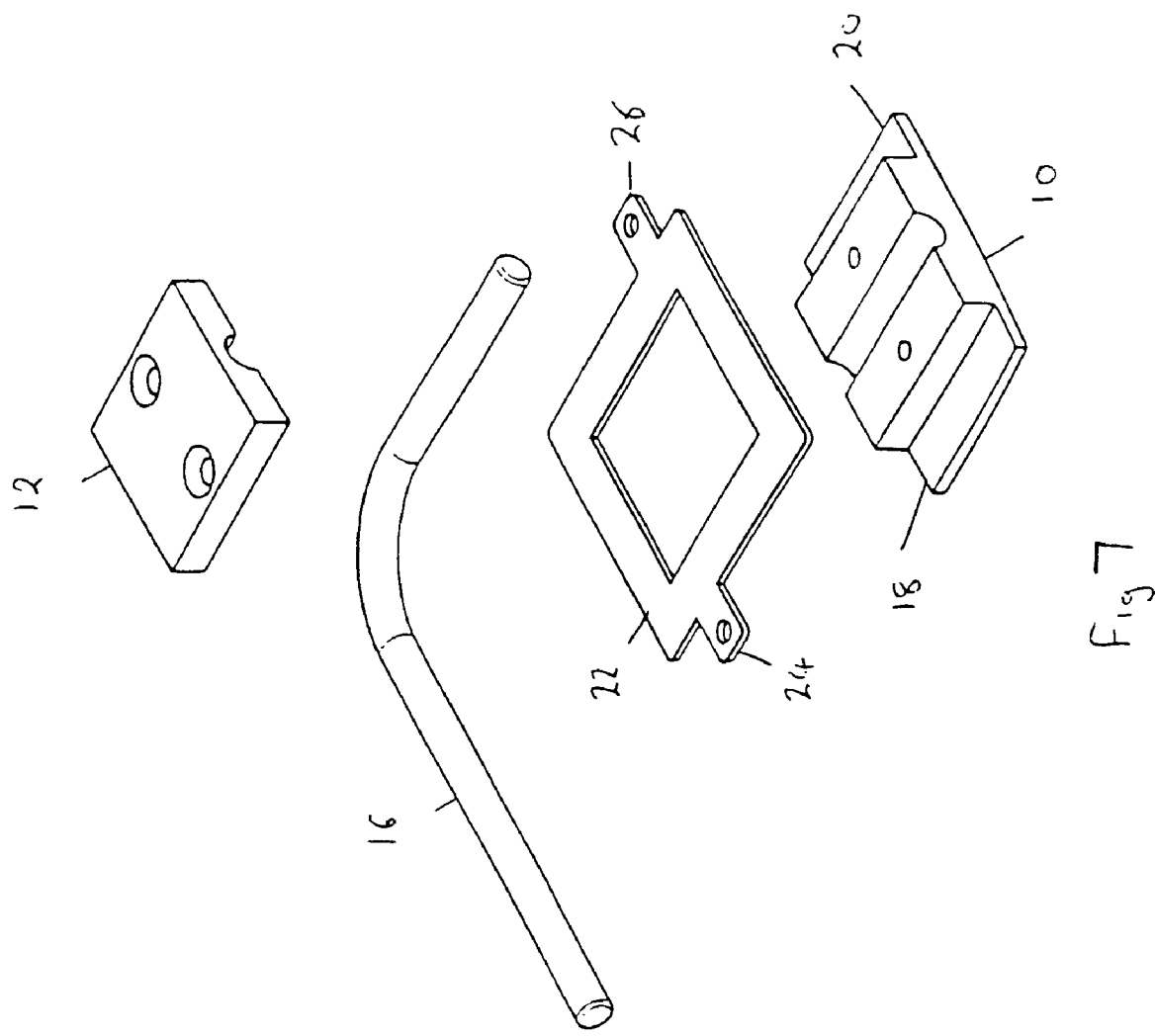
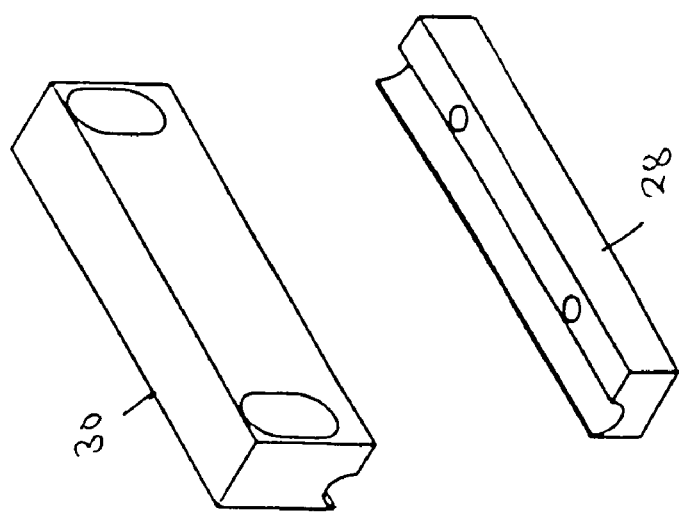
Fig 7

COOLING APPARATUS

FIELD OF THE INVENTION

The present invention relates to a cooling apparatus, and preferably to a cooling apparatus operable to cool an electronic device in a computer.

DESCRIPTION OF THE BACKGROUND ART

As shown in FIG. 10, computers 2 typically comprise a motherboard, or substrate 3, that have one or more microchips 4 disposed thereon that control the functions of the computer. It is important that the temperature of the microchips are maintained within given operating temperatures to ensure optimum performance of the microchip, and hence the computer. However, during operation the microchips will be heated as they consume power supplied to them.

In one known arrangement to cool the microchips, heat sinks and fans are disposed above the or each chip to be cooled. However, this arrangement creates noise due to the operation of the fans.

Therefore, to overcome the above problem fanless cooling means were developed, that comprise a heat sink 6 disposed above the chip. A heat pipe 7 is coupled to the heat sink 6 and connected to a remote heat sink (eg the computer casing 8). Thus heat may be drained away from the chip.

However, motherboards manufactured by individual manufacturers generally place the microchips in variable locations. Thus it is difficult to provide a generic heat sink for use with all microchips and motherboard combinations. In practice a buyer is left with no choice but to buy the heat sink from the same manufacturer as the motherboard, as they will have been created to fasten to the motherboard in specific locations about the or each microchip.

SUMMARY OF THE INVENTION

The present invention seeks to overcome the above problems.

According to the present invention there is provided a cooling apparatus for cooling an electronic device on a substrate, the apparatus comprising:

a first heat sink operable to be disposed in contact with the electronic device, and unconnected with the substrate and the electronic device; and means to bias the first heat sink into contact with the electronic device.

It is preferred that the bias means is unconnected to the first heat sink.

The bias means may comprise a second heat sink. In another preferred embodiment a second heat sink is provided in addition to the bias means. Preferably the second heat sink is attached to the first heat sink. The bias means may urge both, or one of the first and second heat sinks towards the electronic device to be cooled.

It is preferred that the bias means is not connected to either of the heat sinks.

It is preferred that the bias means is connected to the motherboard. More preferably the bias means comprises a rigid frame and one or more connecting means to connect the frame to the motherboard. It is preferred that the connecting means comprises springs, elastic or rubber bands or screws.

Preferably the cooling apparatus comprises a heat pipe, that is connected to the first heat sink, or, if present, the second heat sink. In a most preferred embodiment the heat pipe is clamped between the heat sinks.

The first heat sink may comprise a recess in the surface which contacts the electronic device. Alternatively, guide means may be provided on the lower surface of the heat sink to aid in alignment over the electronic device.

A computer will typically comprises an outer casing, and it is preferred that the heat pipe is attached to the outer casing.

In order that the present invention be more readily understood, specific embodiments thereof will now be described with reference to the accompanying drawings:

DESCRIPTION OF THE DRAWINGS

FIG. 6 shows a perspective view of the components of the embodiment of FIG. 5;

FIG. 7 shows the components of a cooling apparatus according to a third embodiment;

DESCRIPTION OF PREFERRED EMBODIMENTS

Figure 1:
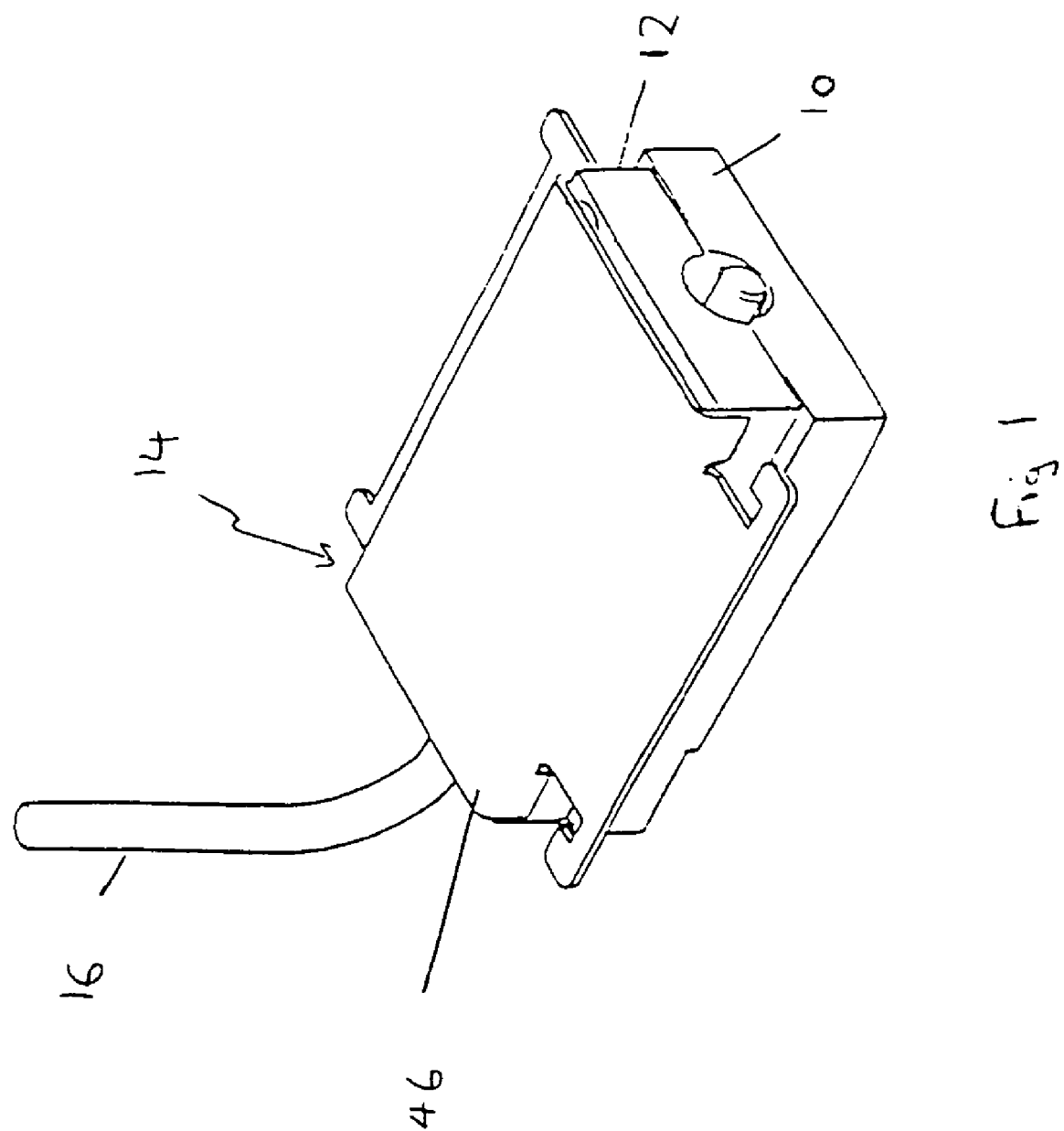
FIG. 1 shows a plan view of a cooling apparatus according to a first embodiment.

A first embodiment will now be described with reference to FIGS. 1 to 3. The cooling apparatus of this embodiment is suitable for cooling a CPU.

The apparatus comprises a first heat sink 10. The heat sink is typically made from copper. The first heat sink comprises a recess in its bottom surface to allow positioning over the CPU. Thermal paste is coated onto the microchip prior to the first heat sink being positioned thereon. Alternatively an adhesive thermal pad could be used.

A second heat sink 12 is fixable to the first heat sink, typically by using screws. The second heat sink is typically made from aluminum.

A heat pipe 16 can be clamped between the first and second heat sinks 10, 12 in a manner similar to the first embodiment. Thus first and second heat sinks each comprises complementary grooves that receive the heat pipe 16. The contact area between the first and second heat sinks and the heat pipe 16 is coated with a thermal cooling paste.

The upper surface of the second heat sink 12 comprises a plurality of recesses 40. In the diagram six recesses are shown, but as will be apparent from the foregoing, more or less will suffice. A spring 42 is mounted in each of the recesses. The springs may or may not be fixed in place.

The motherboard typically comprises a cradle 44 located about the CPU. For example, a Pentium 4 motherboard comprises a specific cradle disposed about the CPU. The cooling apparatus comprises a biasing plate 46 that is operable to couple with the cradle 44, and thereby rest upon the springs 42. This action causes the springs to exert pressure on the second heat sink 12, which in turn biases the first heat sink towards the CPU.

The springs are selected such that sufficient pressure is exerted to maintain the first heat sink into contact with the CPU, but not so much that damage is caused thereto.

The cradle 44 is typically provided on all commercially available motherboards. However, should it not be, alternative means to support the biasing plate 46 can be provided. One example is four screws that can engage with holes or the like in the biasing plate. For example, each corner of the biasing plate may comprises a slot that is operable to receive a screw or bolt. The screws will typically be fixed to the motherboard. The bias plate may be placed in position and fixed into place by nuts or bolts tightened onto the screws.

The heat pipe 16 runs from the first and second heat sinks 10, 12 to a mounting block on the computer casing. The mounting block and the casing act as further heat sinks. Thermal cooling paste may be provided between any of the contact areas.

It will be appreciated that the mounting block may be substituted for a third and fourth heat sink arrangement. In this arrangement the third and fourth heat sinks clamp the heat pipe, and are fixed to the computer casing.

Figure 4:
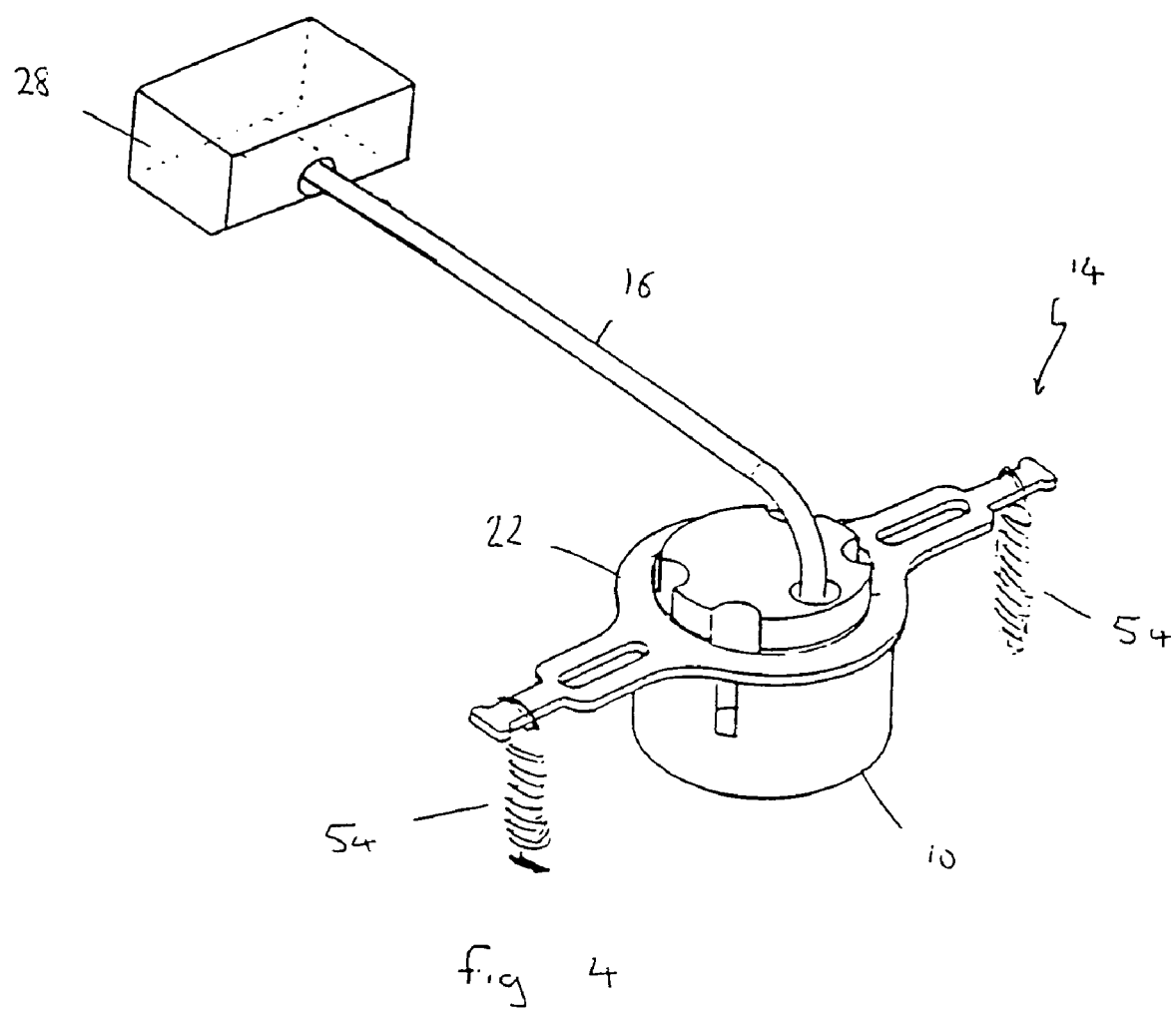
FIG. 4 shows a perspective view of a second embodiment of a cooling apparatus.
Figure 5:
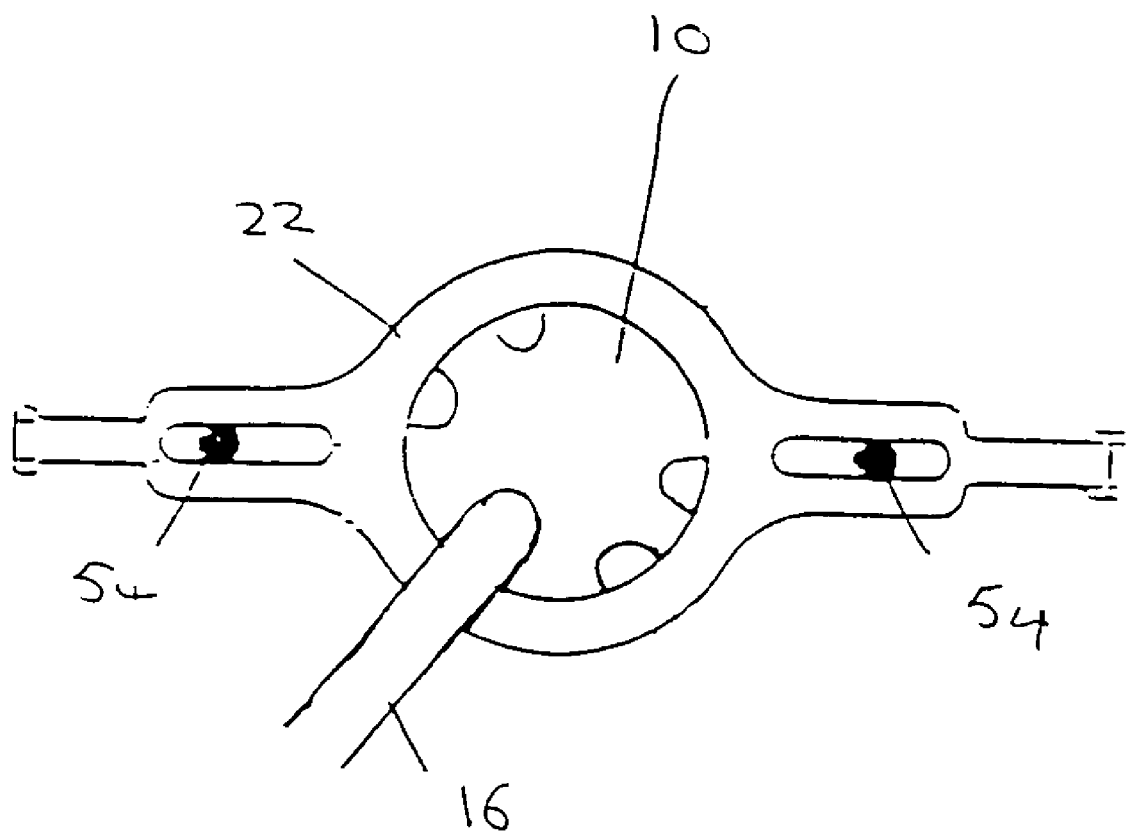
FIG. 5 shows a plan view of a cooling apparatus according to a second embodiment.

A second embodiment will now be described with reference to FIGS. 4 to 6.

This arrangement is suitable for cooling a northbridge chip. The apparatus comprises a first heat sink 10. The first heat sink 10 comprises a block with a flange or shoulder 36 near an upper surface of the heat sink 10. Bias means 14, comprising a frame 22, is configured to rest over the first heat sink, and rest upon the shoulder 36 of the heat sink 10.

The frame 22 of the bias means comprises first and second arms 50, 52. The remote end of each of the arms 50, 52 comprises means 54 to anchor the bias means to the motherboard. Screws are illustrated in FIG. 5. Two screws 54 are attached to the motherboard in appropriate places, and the screws placed through holes in the arms 50, 52 of the frame 22. Nuts or bolts are tightened over the frame onto the screws. Thus the level of bias towards the motherboard can be controlled depending on how tightly the screws are fastened.

Springs may be used instead of screws, with one end of a spring being attached to the motherboard and the other end fastened to one of the arms of the frame. This arrangement is illustrated in FIG. 4. Alternately rubber or elastic bands may be used.

The heat sink comprises two apertures in its top surface. Each aperture is operable to receive a heat pipe.

In use the heat sink can be positioned over the microchip such that it contacts with the microchip, but is not fastened thereto. A thermal pad, or thermal paste is used between the contact area. The heat sink is symmetrical about its vertical axis, and hence can be placed over the microchip in any vertical orientation. The biasing means can be placed over the heat sink and rotated around a vertical axis until the arms 50, 52 are positioned over a suitable place on the motherboard to provide anchorage for the screws or springs and the like. One end a heat pipe 16 can be attached into one of the holes on the heat sink 10. The other end of the heat pipe 16 is attached to the computer casing. The attachment to the computer casing can comprise further heat sinks.

By varying the position of attachment of the heat sink on the casing and the length of the heat pipe, the heat sink can be located in almost any area on the mother board. However, this arrangement allows for the heat sink to be uncoupled from both the substrate and the microchip. The heat sink is held in place by pressure exerted from the bias means.

However, in practice it is inconvenient to alter the length of the heat pipe 16. Thus by rotating the heat sink 10 about its vertical axis until one of the apertures is in a suitable orientation to receive the heat pipe 16 a degree of flexibility in locating the cooling apparatus can be achieved.

In a preferred embodiment each arm 50, 52 may comprises a plurality of apertures, each aperture being operable to receive a screw. Alternatively, each aperture may comprise an elongate slot. Thus a user is given greater flexibility in the areas on the motherboard that can be used as anchor points.

Figure 8:
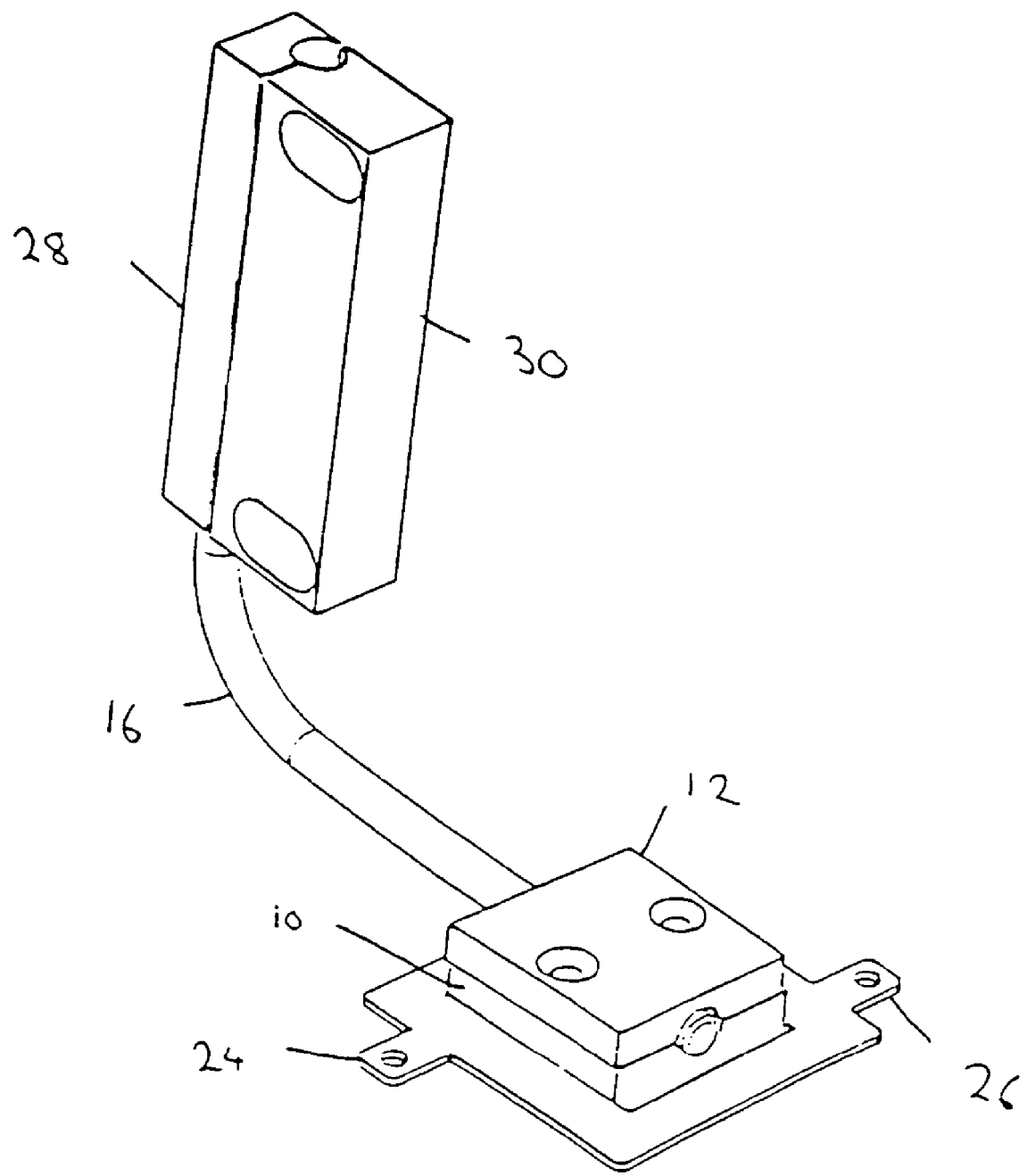
FIG. 8 shows a perspective view of the cooling apparatus of FIG. 7 in use.
Figure 9:
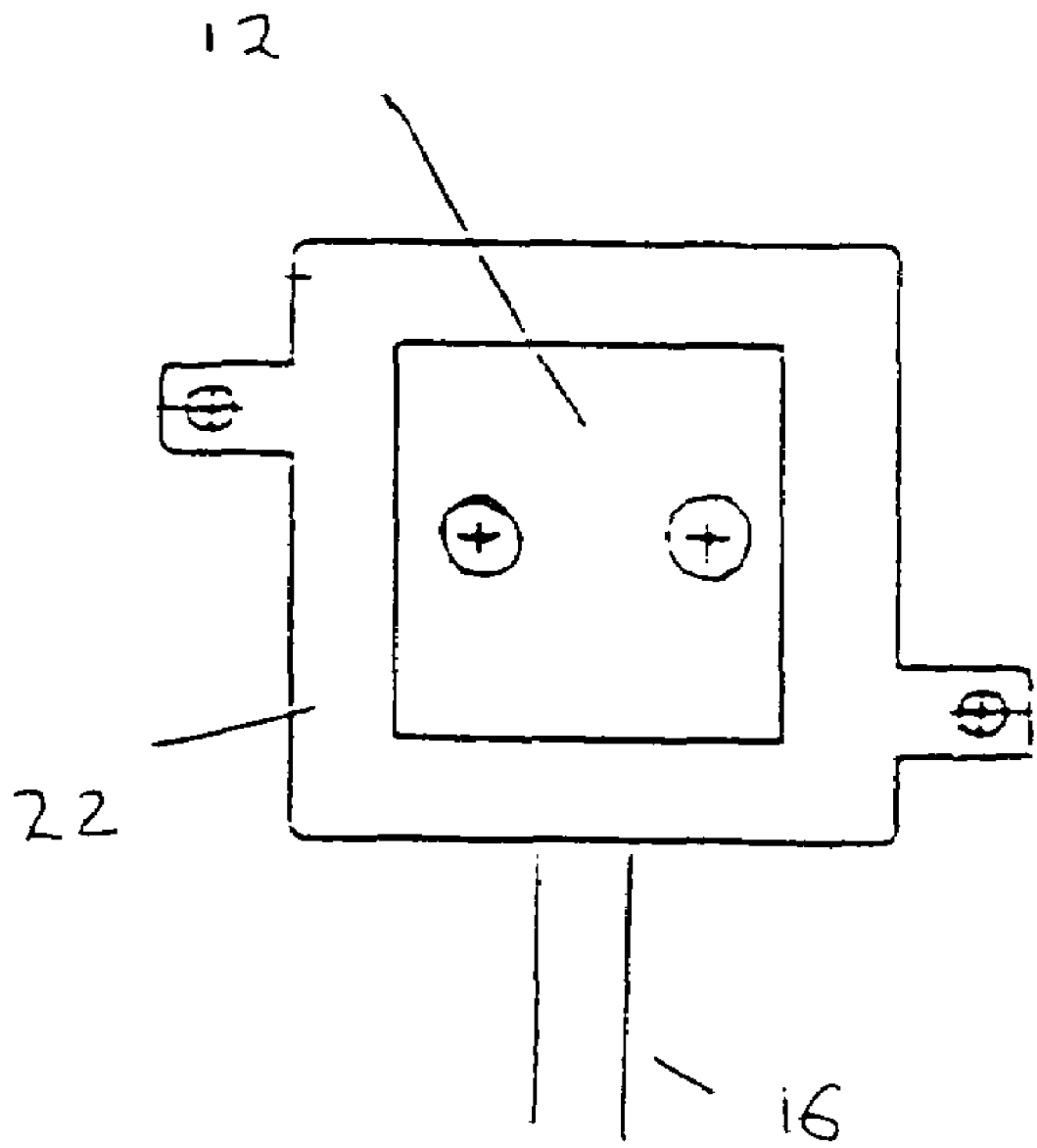
FIG. 9 shows a plan view of the cooling apparatus of FIG. 7.
Figure 10:
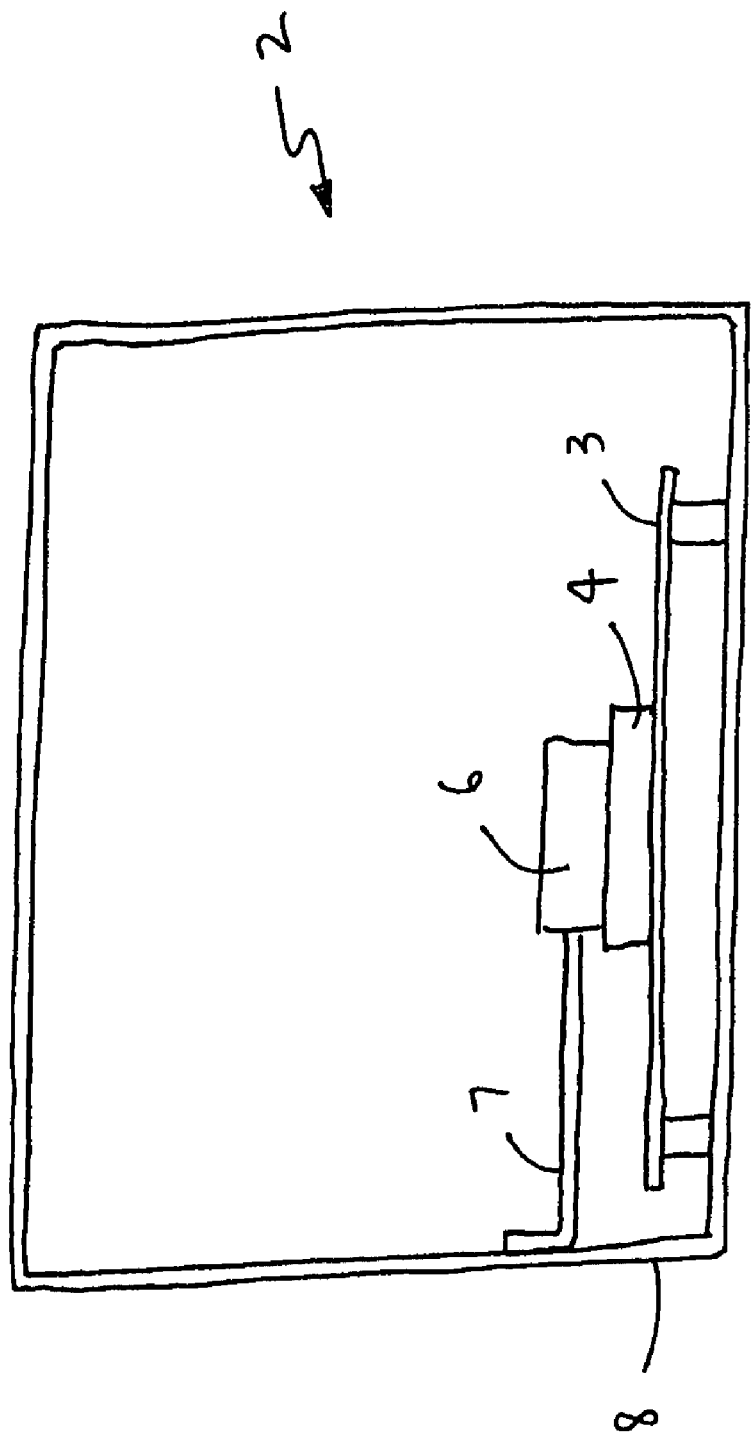
FIG. 10 shows a computer with an electronic device cooled by a heat sink.

According to a third embodiment of the present invention, which is described with reference to FIGS. 7 to 9, there is provided a cooling apparatus operable to cool a graphics chip. The chip is typically located on a substrate (eg a graphics card, which in turn is mounted onto a motherboard. The motherboard is disposed within a computer casing.

The apparatus comprises a first heat sink 10 that is located over a chip. The heat sink may be anything that conducts heat, and that allows heat generated by the microchip to be conducted away therefrom. The first heat sink 10 is connected to a heat pipe 16. A second heat sink 12 is attached to the first heat sink 10 by suitable means, such as screws. Both first and second heat sinks 10, 12 have grooves located in co-operating faces to receive the heat pipe 16, and thus clamp the heat pipe 16 between the two heat sinks 10, 12. The contact areas between the heat pipe 16 and the first and second heat sinks are covered with thermal cooling paste. Thus the heat pipe 16 runs from the heat sinks 10, 12 covering the electronic device to the heat sinks 28 30 fixed to the computer casing.

The first heat sink comprises two flanges 18, 20 disposed on opposite sides of the first heat sink 10. However, in an alternative embodiment the second heat sink 12 could comprise similar flanges as well as, or instead of, the first heat sink.

Bias means 14 comprises a frame 22. The frame 22 is operable to fit over the first and second heat sinks 10,12 and rest upon flanges 18, 20. The frame 22 includes two protrusions 24, 26, each having an aperture.

Figure 2:
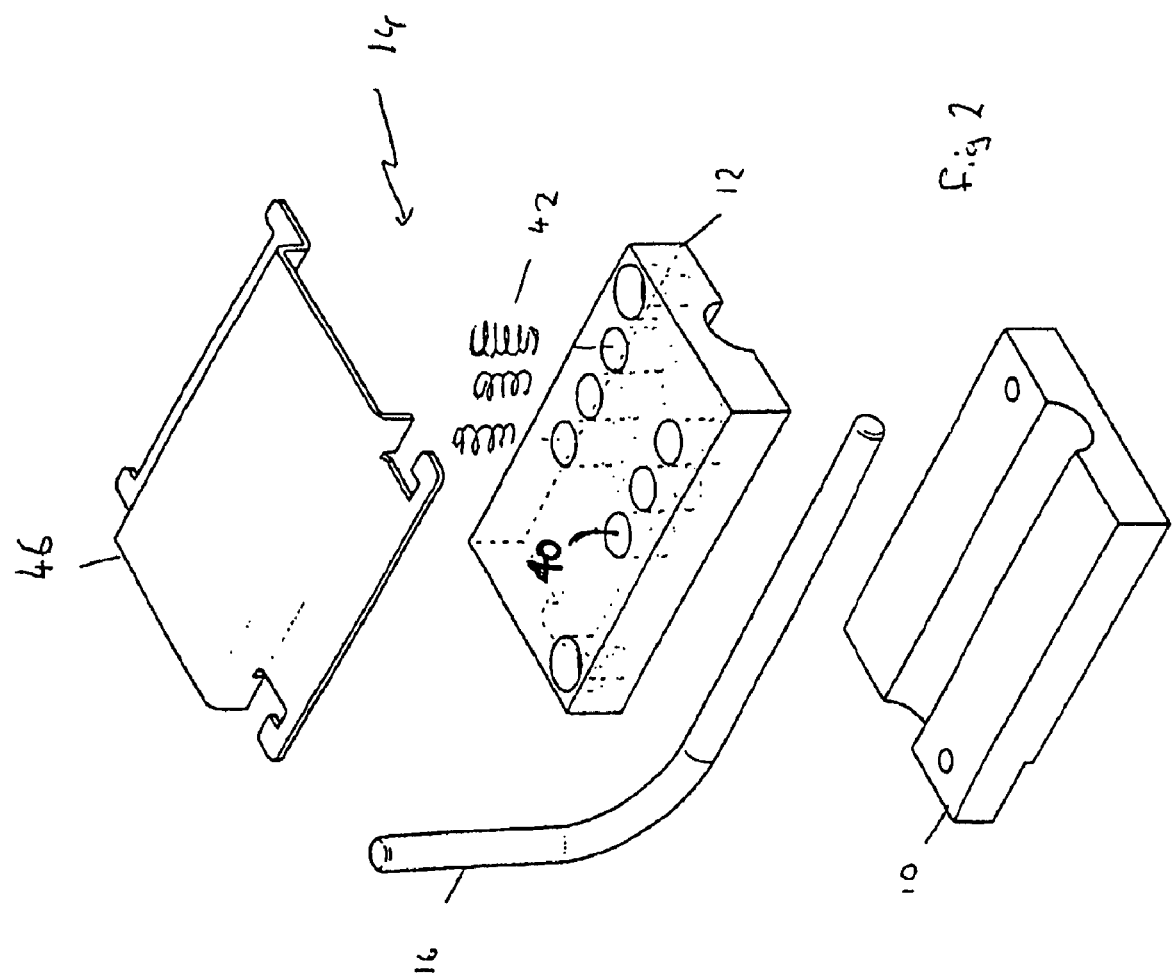
FIG. 2 shows a perspective view of the embodiment of FIG. 1 in an exploded state.
Figure 3:
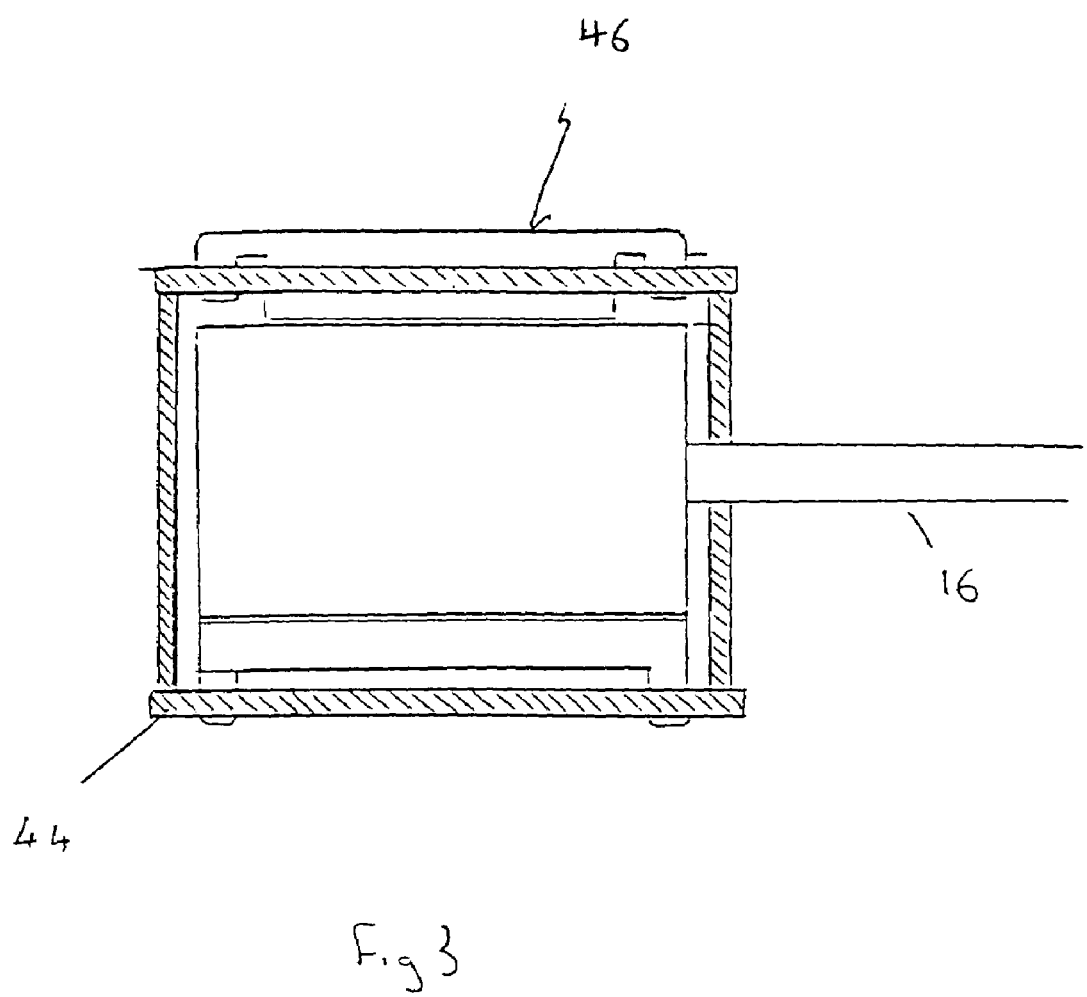
FIG. 3 shows a perspective view of the first embodiment.

The protrusions are located on opposite sides of frame 22, as shown in FIGS. 1 to 3. The protrusions 24, 26 are also offset to one side of the frame 22, such that they are substantially diagonally opposite one another.

Preferably the heat sinks 10, 12 and the frame 22 are square, and thus allow the frame to be placed over the heat sinks 10, 12 in any orientation. Thus the frame 22 can be turned to allow the protrusions to placed above the most suitable place for anchorage on the substrate.

A mounting is disposed on the computer casing. The mounting comprises two blocks that function as heat sinks (hereinafter referred to as third and fourth heat sinks 28, 30). Each of the third and fourth heat sinks 28, 30 comprises co-operating grooves such that the heat pipe 16 can be located between the heat sinks. The inside of the grooves are covered with thermal cooling paste.

In use the first heat sink 10 is positioned over the graphics chip. Typically thermal paste, or a thermal pad is used between the heat sink and the microchip. The bias means 14 is positioned over the first heat sink 10. Screws 54 are placed through the apertures in the protrusions 24, 26 and fastened to the motherboard to bias the first heat sink 10 into place. Thus it will be appreciated that the first heat sink 10 is unattached to the microchip, and held in place by the bias means 14.

It will be appreciated that the screws can be replaced by springs, or other resilient members such as rubber or elastic bands.

The screws or springs operate to bias the frame, and hence the first heat sink against the chip.

The heat pipe 16 is placed in the groove in the first heat sink. The second heat sink 12 is fastened to the first heat sink 10, typically by screws. This action clamps the heat pipe between the heat sinks. The other end of the heat pipe is clamped between the third and fourth heat sinks 28, 30. One or both of the third and fourth heat sinks 28, 30 are fastened to the casing. It will be appreciated that the computer casing acts as a further heat sink.

By adjusting where the third and fourth heat sinks 28, 30 are attached to the casing, and the length of the heat pipe 16 the first heat sink 10 can be disposed in substantially any location on the motherboard. The frame 22 can then be rotated to a desired position to allow the fastening screws or springs to be attached to the motherboard in a suitable place.

In each described embodiment it will be appreciated that the first heat sink, being the heat sink in contact with the electronic device to be cooled, is unconnected to the electronic device, or the motherboard.

Thus the first heat sink can be positioned in a desired orientation, dependent upon the position of the electronic device to be cooled.

The first heat sink is maintained in position by a biasing device. The biasing device can be attached to the motherboard in a plurality of orientations by, for example, rotating the biasing means until suitable anchorage areas are aligned with the biasing device.

It will be appreciated that the above described embodiments are described as examples only, that that various modifications are included within the scope of the appended claims.

I claim:

1. A cooling apparatus for cooling an electronic device on a substrate, the apparatus comprising:
   a first heat sink operable to be disposed in contact with an electronic device, and without permanent connection with a substrate or the electronic device;
   a second heat sink in contact with the first heat sink;
   a biasing plate fixed to the substrate, and
   a plurality of springs positioned between the biasing plate and the top surface of the second heat sink, whereby the springs bias the second heat sink against the first heat sink, and towards the electronic device.

2. A cooling apparatus according to claim 1, wherein the bias plate is without permanent connection with the second heat sink.

3. A cooling apparatus according to claim 1, wherein the bias plate comprises means to attach the cooling apparatus to the substrate.

4. A cooling apparatus according to claim 1, wherein the second heat sink substantially covers the first heat sink.

5. A cooling apparatus according to claim 1, wherein the second heat sink is connected to the first heat sink.

6. A cooling apparatus according to claim 1, further including at least one heat pipe.

7. A cooling apparatus according to claim 1, wherein the first heat sink includes a recess.

8. A computer comprising a cooling apparatus according to claim 1.

9. A cooling apparatus for cooling an electronic device on a substrate, the apparatus comprising:
   a first heat sink;
   a second heat sink in contact with the first heat sink; and
   biasing means coupled to at least one structure associated with an electronic device and positioned with respect to said first and second heat sinks to bias the first heat sink into contact with the electronic device, wherein said biasing means comprises a plurality of springs distributed over a surface of the second heat sink to bias the second heat sink against the first heat sink, and towards the electronic device.

10. The apparatus of claim 9, comprising a cradle for said electronic device.

11. A computer comprising the cooling apparatus of claim 9.

12. The cooling apparatus of claim 1, wherein a heat pipe is clamped between the first heat sink and the second heat sink.

* * * * *